United States Patent
Tan et al.

[11] Patent Number: 5,898,574
[45] Date of Patent: Apr. 27, 1999

[54] SELF ALIGNING ELECTRICAL COMPONENT

[76] Inventors: Wiling Tan, 42 Lebohraya Gelugor, Jelutong, Malaysia, 11600; Raymond Teh Wai Tiong, 24, Lrg. Setiabistari Satu, Damansara Heights, Malaysia, 50490; Lian It Song, G. Persiaran Bukit Kecil 6, Penang, Malaysia, 11900

[21] Appl. No.: 08/926,082
[22] Filed: Sep. 2, 1997
[51] Int. Cl.⁶ ............................................. H05K 7/02
[52] U.S. Cl. .................. 361/777; 361/767; 361/773; 361/774; 361/782; 361/783; 257/692; 257/693; 257/730; 257/786; 174/260; 174/261; 228/180.21
[58] Field of Search ...................... 361/760, 767, 361/772–774, 777, 782, 783, 306.1; 174/250, 260, 261, 52.4; 228/180.21; 257/678, 686, 692, 693, 730, 779, 786

[56] References Cited

U.S. PATENT DOCUMENTS

| | | | |
|---|---|---|---|
| 3,335,339 | 8/1967 | Schuler | 257/691 |
| 3,566,003 | 2/1971 | Wislocky | 257/730 |
| 4,164,778 | 8/1979 | Sawairi et al. | 361/777 |
| 4,641,222 | 2/1987 | Derfiny et al. | 361/768 |
| 4,801,904 | 1/1989 | Sakamoto et al. | 333/182 |
| 4,978,972 | 12/1990 | Volpe, Jr. et al | 347/201 |

*Primary Examiner*—Leo P. Picard
*Assistant Examiner*—John B. Vigushin

[57] ABSTRACT

An electrical device (400) includes a substrate (300) having solder pads (215, 220) formed thereon and a self aligning electrical component (200) mounted to the solder pads (215, 220). The self aligning electrical component (200) includes a body having a cylindrical shape, a first terminal (205) formed on an inner region of the body, and a second terminal (210) formed around outer regions of the body surrounding the first terminal (205).

4 Claims, 5 Drawing Sheets

5,898,574

SELF ALIGNING ELECTRICAL COMPONENT

TECHNICAL FIELD

This invention relates in general to electrical components, and more specifically to surface mount electrical components.

BACKGROUND OF THE INVENTION

Electronic devices often include surface mounted parts that are placed on a substrate then bonded to solder pads during a solder reflow process in which heat is applied to the substrate. Conventionally, a surface mounted part is placed onto the substrate, then solder disposed between the solder pads and the part liquefies during the reflow process. The substrate is then cooled, and the solder hardens to bond terminals of the part to solder pads of the substrate.

A surface mounted part can easily be placed incorrectly on the substrate during the assembly process, in which case the part can be bonded in an incorrect orientation, resulting in mechanical and electrical defects. To solve this problem, a fixture can be designed to hold the part in place during reflow. Alternatively, a top pallet can be constructed with cutouts for the surface mounted parts. The top pallet is laid over the substrate to eliminate part movement during reflow. Both of these solutions can be expensive and labor-intensive, however, and this cost is often passed on to the customer in the form of increased product costs.

Thus, what is needed is a better way to properly align components in an electronic device.

DETAILED DESCRIPTION OF THE PREFERRED EMBODIMENT

Figure 1:
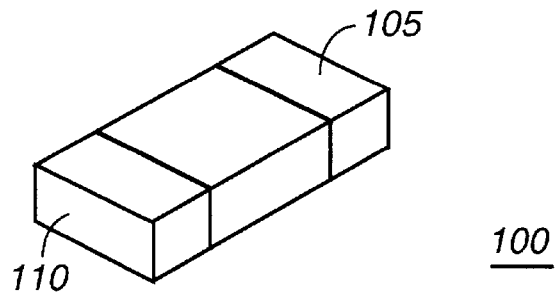
FIG. 1 is a perspective view of a conventional surface mount electrical component.

While the specification concludes with claims defining the features of the invention that are regarded as novel, it is believed that the invention will be better understood from a consideration of the following description in conjunction with the drawing figures, in which like reference numerals are carried forward.

FIG. 1 shows a conventional two-terminal surface mount electrical component 100, such as a resistor, a diode, or a capacitor, that includes plated terminals 105, 110 suitable for bonding to conventional solder pads formed on a printed circuit board, flexible circuit board, or other substrate. The component 100 includes a first rectangular terminal 105 at a first end of its body and a second rectangular terminal 110 at a second end of its body.

Figure 2:
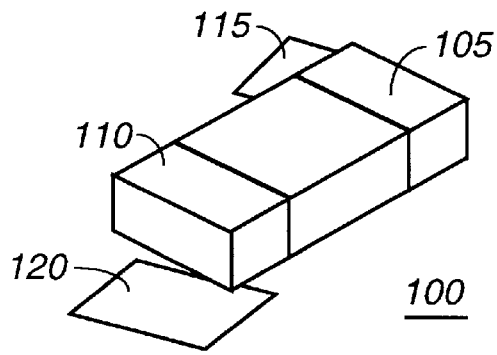
FIGS. 2 and 3 are perspective views of alignment defects that can occur during reflow of the conventional surface mount electrical component of FIG. 1.
Figure 3:
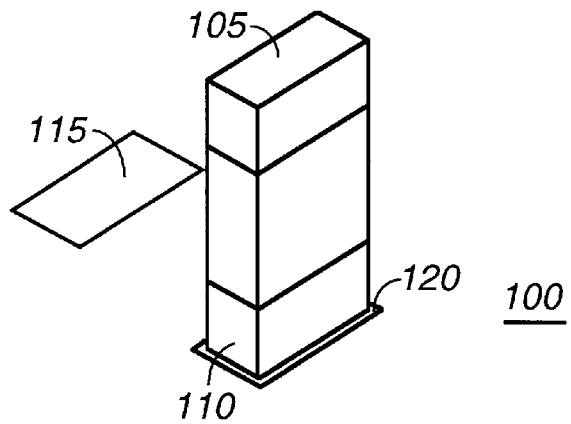

Referring next to FIGS. 2 and 3, common solder defects are depicted for the conventional component 100. As shown in FIG. 2, the component 100 can be reflowed in a skewed configuration in which neither terminal 105, 110 is securely mounted to its corresponding solder pad 115, 120. Skewed mounting of the component 100 can result from erroneous placement of the component 100 prior to reflow or abrupt movement of a substrate (not shown) on which the solder pads 115, 120 are formed after placement of the component 100. This type of positioning error can ultimately cause electrical malfunctions since the solder joints can easily be broken. FIG. 3 illustrates a "tombstone" defect in which the component 100 has been pulled into an upright position during placement or reflow. This type of defect usually results when the component 100 has been placed into contact with only a single solder pad 120, subsequent to which the surface tension of the liquefied solder pulls the component 100 upright during reflow.

These types of solder defects often cause inoperable products or products that malfunction after only a short period of time. Such products must be reworked in the factory or repaired under warranty, resulting in added expenditures of money, time, and labor on the part of the manufacturer.

Figure 4:
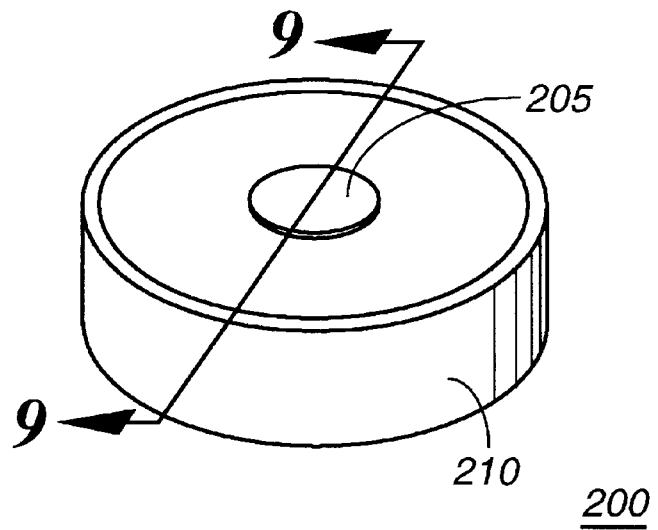
FIG. 4 is a perspective view of a two-terminal surface mount component fabricated in accordance with the present invention.

Referring next to FIG. 4, a self aligning electrical component 200 includes a body formed in part from a material, such as ceramic, used to fabricate conventional surface mount chip components. The self aligning electrical component 200 is preferably a two terminal device, such as a resistor, diode, or capacitor, and, as such, comprises two terminals 205, 210 for mounting the component 200 to a substrate (not shown). According to the present invention, the body of the component 200 has a cylindrical shape. More specifically, the exterior of the component 200 includes a flat top surface formed in the shape of a circle and having a particular diameter and an opposing flat bottom surface not shown) formed in a circular shape and having substantially the same diameter. Both the top and bottom surfaces are approximately equal in size and formed about the same axis that runs through the center of the component body. A tubular side surface having a particular height connects the top and bottom surfaces of the component 200. Although the bottom surface is not depicted in FIG. 4, its appearance is similar to that of the top surface.

The terminals 205, 210 are coaxial in form. In other words, a first terminal 205 is formed both on an inner region of the top surface and an inner region of the bottom surface, preferably in the form of a circular metallized terminal formed about the same axis as the top and bottom surfaces and having a diameter approximately ⅓ of the diameter of the top and bottom surfaces. The second terminal 210 is formed around outer regions of the component body to cover the sides of the component 200 and extend in a circular pattern onto the top and bottom surfaces. Preferably, the second terminal 210 extends around the entire circumferences of the top and bottom surfaces and onto the top and bottom surfaces for a distance that is approximately ⅙ of the diameter of the top and bottom surfaces. As shown, the first and second terminals 205, 210 are not in direct contact.

Figure 5:
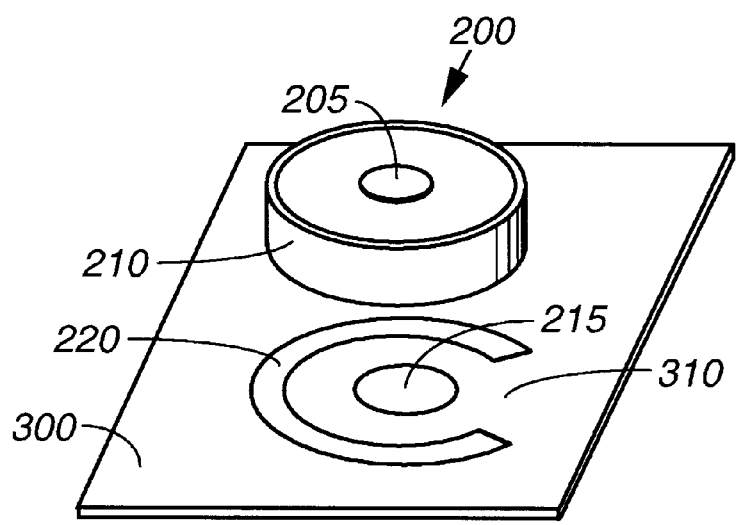
FIG. 5 is a perspective view of solder pads that can be formed on a substrate for mounting the two-terminal surface mount component of FIG. 4 in accordance with the present invention.

FIG. 5 illustrates a solder pad design that is formed on a surface of a substrate 300, such as a printed circuit board or flexible circuit board included in an electrical device, e.g., a battery or cellular telephone, in accordance with the present invention. The solder pads 215, 220 to which the self aligning electrical component 200 is mounted include a first circular pad 215 that corresponds to the first terminal 205, which, as mentioned above, is mirrored on the bottom surface of the component 200. The first solder pad 215 preferably is substantially the same size as the first terminal 205. A second circular pad 220 forms a concentric ring about the first pad 215. The second pad 220 corresponds to the second terminal 210 of the component 200. As shown, the second pad 220 does not form a complete circle; instead, it forms a shape similar to a "c". As a result, etched metal can be routed from the first solder pad 215 through the opening 310 of the second solder pad 220 to couple the first terminal 205 of the component 200 to other electrical circuitry (not shown). To do this, a layer of insulative material is used to cover the metallized runner extending through the opening 310 in a conventional manner so that a single layer substrate 300 can be employed.

Figure 6:
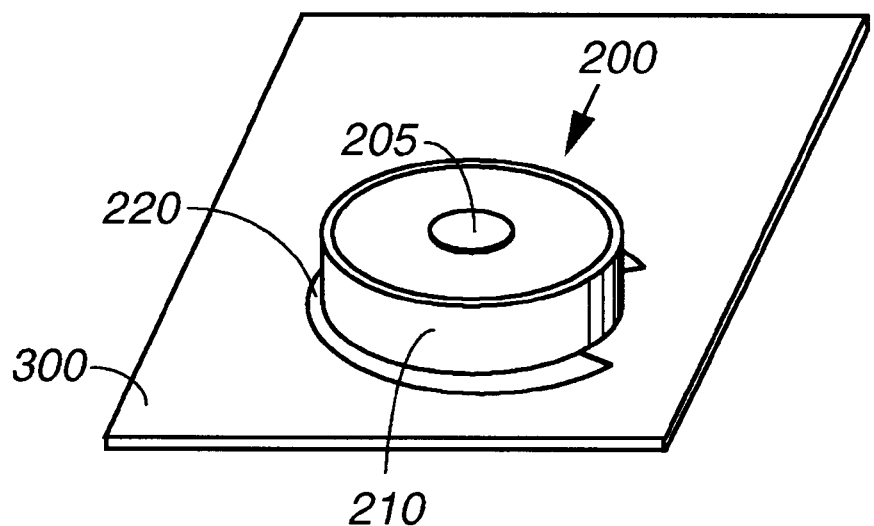
FIG. 6 is a perspective view of the component of FIG. 4 mounted to he solder pads of FIG. 5 in accordance with the present invention.

FIG. 6 depicts the electrical component 200 after it has been surface mounted to the solder pads 215, 220 of the substrate 300 in a conventional solder reflow operation. As shown, the component 200 is centered on the solder pads 215, 220 by the surface tension of liquefied solder during reflow, thereby resulting in a configuration in which the component 200 has been pulled into place without defects.

Figure 7:
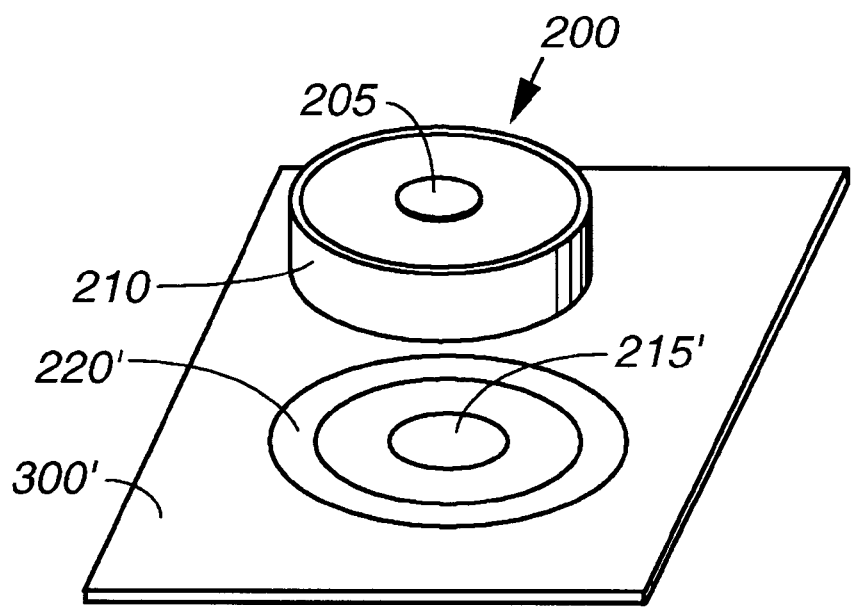
FIG. 7 is a perspective view of different solder pads that can be formed on a substrate for mounting the two-terminal surface mount component of FIG. 4 in accordance with the present invention.

Referring next to FIG. 7, an alternate embodiment of a solder pad design is depicted. When a multilayer substrate 300' is used, the solder pads 215', 220' can be formed such that no opening is provided in the second, surrounding pad 220'. In other words, the first solder pad 215' is similar to the first solder pad 215 of FIG. 5; the second solder pad 220', however, forms a complete circle around the first pad 215'. This solder pad arrangement pulls the component 200 into alignment just as reliably as does the solder pad arrangement of FIG. 5, but another substrate layer should be provided for proper coupling of the component 200 to other circuitry.

Figure 8:
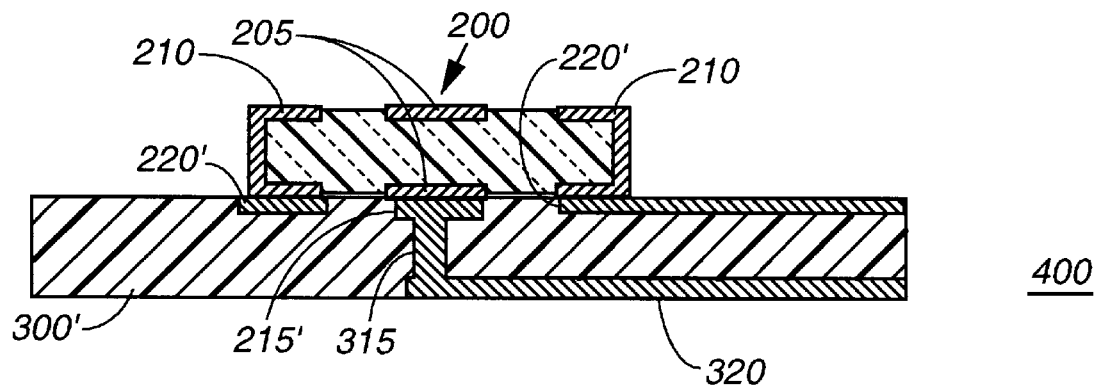
FIG. 8 is a side view of the component of FIG. 4 mounted to the solder pads of FIG. 5 in accordance with the present invention.

FIG. 8 is a side view of the multilayer substrate 300' comprising the solder pads 215', 220' formed according to the alternate embodiment of the present invention. As shown, the first terminal portion 205 formed on the bottom surface of the component 200 is mounted to the first solder pad 215'.

The second terminal portions 210 that surround the exteriors of the top and bottom surfaces are coupled to the second solder pad 220', which fully surrounds the first pad 215'. The component 200 is coupled to other electrical circuitry (not shown) by a conductive runner 320 formed on another substrate layer. The conductive runner 320 is coupled to the first, interior solder pad 215' by a through-hole 315, the interior of which has been plated with a conductive material in a conventional manner.

The self aligning electrical component 200 according to the present invention is formed in the shape of a flat disk that has symmetrical top and bottom surfaces. The two terminals 205, 210 of the component 200 are formed in concentric circles on both the top and bottom surfaces so that they are arranged coaxially. Therefore, the component 200 can be easily picked up and positioned by machinery or by a human operator without regard to top or bottom orientation of the component 200. Furthermore, the circular arrangement of the terminals 205, 210 and of corresponding solder pads provides a mechanism by which the component 200 is reliably pulled into alignment during reflow so that conventional solder defects do not result.

Therefore, an electrical device, such as a telephone or a battery, that includes the component 200 can be manufactured with fewer malfunctions and fewer warranty repairs due to solder defects. Electrical devices that include conventional surface mount components are more likely to have problems that result from skewed components or components that do not properly contact solder pads formed on a device substrate.

The self aligning electrical component 200 can incorporate any two terminal device, such as a resistor, diode, or capacitor. The materials used in the manufacturing of the component 200 are very similar to those used in manufacturing conventional devices. Fabrication of different two terminal devices in the form factor of the self aligning electrical component 200 can be better understood by referring to FIGS. 9–11.

Figure 9:
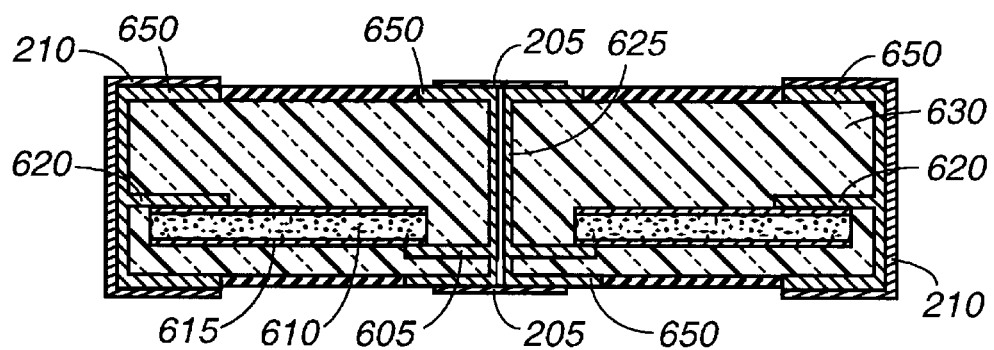
FIGS. 9–11 are side, cutaway views of different types of components that can be fabricated in accordance with the present invention.

FIG. 9 is a side, cutaway view of the component 200 along lines 9—9 (FIG. 4) when the component is a diode 600. The diode 600 is formed by encapsulating a doped silicon die 610 with ceramic material 630, which preferably comprises top and bottom portions for sandwiching the die 610 therebetween. The silicon die 610, which is round, has been cut from a conventional silicon wafer, doped, and masked with copper 615. A laser is then used to cut a hole through the die 610. Before the die 610 is placed into a bottom portion of the ceramic material 630, silver plating 605 is printed onto the ceramic 630 to provide electrical conductivity from the bottom surface of the die 610. Once situated in the bottom ceramic portion, top perimeter silver plating 620 is coated onto the die 610 to provide an electrical connection to the top surface of the die 610. Thereafter, the die 610 is encapsulated in both portions of the ceramic 630, and leads 650 of the diode 600 are formed using a silver plating. Central leads 650 of the diode 600 are coupled via a through hole 625 that is drilled by a laser then plated with tin or another conductive material. The leads 650 are coated with a solderable material to form the terminals 205, 210, and areas on surfaces of the body between the terminals 205, 210 are covered with insulative material, which could, for example, comprise additional ceramic material.

Figure 10:
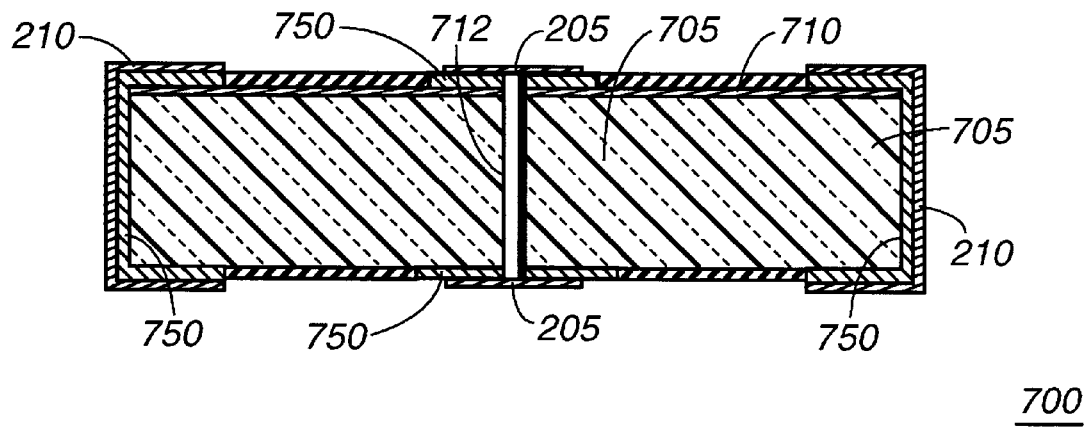

FIG. 10 is a side, cutaway view of the component 200 along lines 9—9 when the component 200 comprises a resistor 700. Much like a standard resistor, the resistor 700 according to the present invention includes ceramic material. To form the resistor 700, a ceramic material 705 is formed into a round shape with the aid of molds that are filled with ceramic, which is then allowed to cure. Resistive ink 710 is then printed onto the surface of the ceramic 705. The respective leads 750 of the resistor 700 are formed using a silver plating that is printed to conduct current at terminations of the resistive ink 710. The central leads 750 of the resistor 700 are electrically coupled via a through hole 712 created with a laser and plated with tin. The leads 750 are then coated with a solderable material, such as nickel coated with tin, to form the terminals 205, 210, and areas on surfaces of the body between the terminals 205, 210 are covered with insulative material, which could, for example, comprise additional ceramic material.

Figure 11:
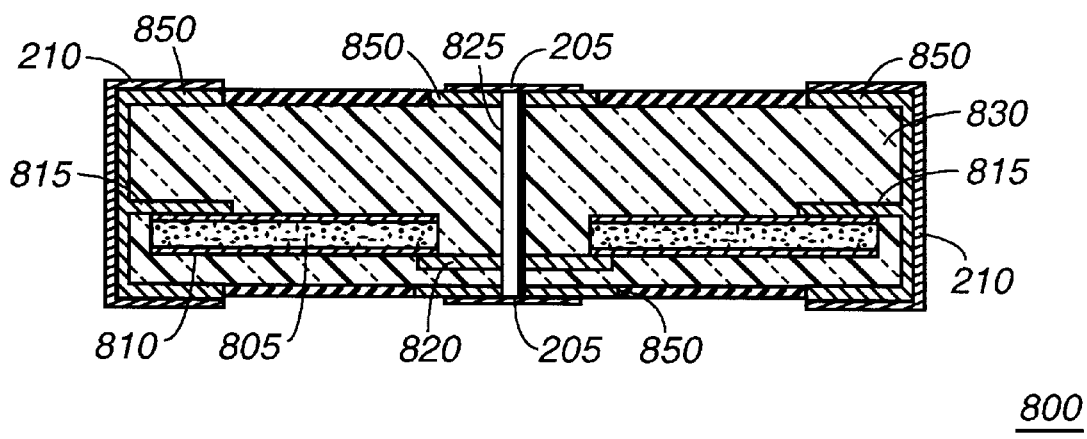

FIG. 11 is a side, cutaway view of the component 200 along lines 9—9 when the component is a capacitor 800. The capacitor 800 is formed in a manner similar to formation of the diode 600, except that the die 610 (FIG. 9) of the diode 600 is replaced with a dielectric material 805 with a hole in the middle. The resultant specification of the capacitor 800 is dependent on the thickness of the dielectric material 805 that is sandwiched between the copper masking 810 and the top and bottom portions of the ceramic encapsulant 830.

As is the case with the diode 600, the capacitor 800 includes silver plating 820 beneath the dielectric material 805 for conducting from the bottom surface of the dielectric material 805 and top perimeter silver plating 815 for conducting from the top surface of the dielectric material 805. Silver plating is additionally utilized to form the component leads 850, which are coated with a solderable material to form the terminals 205, 210, and areas on surfaces of the body between the terminals 205, 210 are covered with insulative material, which could, for example, comprise additional ceramic material. A through hole 825 couples central leads 850 of the capacitor 800.

In summary, the self aligning electrical component described above can be fabricated using many conventional materials to form a symmetrical, disk-like body that is easily handled and placed by both machinery and human operators. The component according to the present invention includes electrically coupled circular terminals on both the first and second opposing surfaces that are similar in size, shape, and location. These terminals provide electrical connection to a first termination of the component and are preferably located in the centers of the top and bottom component surfaces. Electrical conductivity to a second termination of the component is provided via a circular terminal that surrounds the central terminals formed on the top and bottom component surfaces to form outer rings on the top and bottom surfaces. Since both the top and bottom surfaces of the component as well as its two end terminals are symmetrical, the likelihood of placement errors is slim. Additionally, the circular terminals, when coupled with corresponding circular solder pads, ensure that the solder reflow operation will easily and reliably pull the component into alignment to prevent solder defects. As a result, the component according to the present invention is less likely to cause product malfunctions than are conventional surface mount components.

It will be appreciated by now that there has been provided a self aligning electrical component that can be more reliably placed and soldered onto a substrate of an electrical device.

What is claimed is:

1. An electrical device, comprising:
   a substrate having solder pads formed thereon, the solder pads including a first circular pad surrounding a second circular pad, wherein the first and second circular pads are not in direct contact; and
   a self aligning electrical component mounted to the solder pads, the self aligning electrical component comprising:
   a body having a cylindrical shape;
   a first terminal formed on inner regions of the body and coupled to the second circular pad; and
   a second terminal formed around outer regions of the body surrounding the first terminal, the second terminal coupled to the first circular pad.

2. A self aligning electrical component, comprising:
   a body having a cylindrical shape;
   a first terminal formed on an inner region of the body; and
   a second terminal formed on outer regions of the body and surrounding the first terminal;
   wherein the self aligning electrical component is mounted to solder pads formed on a substrate, wherein the solder pads include a first circular pad surrounded by a second circular pad, and wherein the first and second circular pads are not in direct contact.

3. An electrical device, comprising:
   a substrate having solder pads formed thereon; and
   a self aligning electrical component mounted to the solder pads, the self aligning electrical component comprising:
   a body having a cylindrical shape;
   a first terminal formed on an inner region of the body; and
   a second terminal formed around outer regions of the body surrounding the first terminal;
   wherein the first terminal is formed around an axis through a center of the body;
   wherein the self aligning electrical component is a diode.

4. An electrical device, comprising:
   a substrate having solder pads formed thereon; and
   a self aligning electrical component mounted to the solder pads, the self aligning electrical component comprising:
   a body having a cylindrical shape;
   a first terminal formed on an inner region of the body; and
   a second terminal formed around outer regions of the body surrounding the first terminal;
   wherein the first terminal is formed around an axis through a center of the body;
   wherein the solder pads include a first circular pad surrounding a second circular pad, and wherein the first and second circular pads are not in direct contact.

* * * * *